(12) United States Patent
Nishio et al.

(10) Patent No.: US 12,191,337 B2
(45) Date of Patent: Jan. 7, 2025

(54) IMAGING UNIT, METHOD FOR MANUFACTURING THE SAME, AND ELECTRONIC APPARATUS

(71) Applicant: SONY SEMICONDUCTOR SOLUTIONS CORPORATION, Kanagawa (JP)

(72) Inventors: Kenya Nishio, Kanagawa (JP); Suguru Saito, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 72 days.

(21) Appl. No.: 18/060,216

(22) Filed: Nov. 30, 2022

(65) Prior Publication Data

US 2023/0107566 A1 Apr. 6, 2023

Related U.S. Application Data

(63) Continuation of application No. 17/044,460, filed as application No. PCT/JP2019/008589 on Mar. 5, 2019, now Pat. No. 11,538,843.

(30) Foreign Application Priority Data

Apr. 9, 2018 (JP) ................................. 2018-074755

(51) Int. Cl.
*H01L 27/146* (2006.01)
*H01L 23/00* (2006.01)

(52) U.S. Cl.
CPC ........ *H01L 27/14634* (2013.01); *H01L 24/32* (2013.01); *H01L 27/14636* (2013.01); *H01L 27/1469* (2013.01); *H01L 2224/32145* (2013.01)

(58) Field of Classification Search
CPC .......................... H01L 27/14634; H01L 24/32
See application file for complete search history.

(56) References Cited

U.S. PATENT DOCUMENTS

| 2012/0049355 A1 | 3/2012 | Hosokawa et al. |
| 2012/0242876 A1 | 9/2012 | Hagiwara |
(Continued)

FOREIGN PATENT DOCUMENTS

| CN | 103579273 A | 2/2014 |
| JP | 2005-252183 A | 9/2005 |
(Continued)

OTHER PUBLICATIONS

International Search Report and Written Opinion of PCT Application No. PCT/JP2019/008589, issued on May 14, 2019, 09 pages of English Translation and 08 pages of ISRWO.
(Continued)

*Primary Examiner* — Thao P Le
(74) *Attorney, Agent, or Firm* — CHIP LAW GROUP

(57) ABSTRACT

Provided is an imaging unit more efficiently manufacturable with high dimensional precision. The imaging unit includes: a sensor board including an imaging device, in which the imaging device has a plurality of pixels and allows generation of a pixel signal by receiving outside light in each of the plurality of pixels; a bonding layer including an inorganic insulating material; and a circuit board including a circuit chip and an organic insulating layer, in which a circuit chip has a signal processing circuit that performs signal processing for the pixel signal and is bonded to the sensor board through the bonding layer, and the organic insulating layer covers a vicinity of the circuit chip.

10 Claims, 9 Drawing Sheets

(56) References Cited

U.S. PATENT DOCUMENTS

| | | |
|---|---|---|
| 2013/0020468 A1 | 1/2013 | Mitsuhashi et al. |
| 2014/0042576 A1 | 2/2014 | Toyoda |
| 2014/0334601 A1 | 11/2014 | Shizukuishi |
| 2016/0240571 A1 | 8/2016 | Baek |
| 2016/0343763 A1 | 11/2016 | Kagawa et al. |
| 2017/0257587 A1 | 9/2017 | Hatano et al. |
| 2017/0331062 A1 | 11/2017 | Tamaki |
| 2018/0138225 A1* | 5/2018 | Kim .................. H01L 27/14645 |
| 2018/0145104 A1* | 5/2018 | Kim .................... H01L 27/1462 |
| 2018/0197906 A1 | 7/2018 | Yamaguchi et al. |
| 2018/0204882 A1 | 7/2018 | Segawa et al. |
| 2018/0277584 A1 | 9/2018 | Maruyama |
| 2018/0342627 A1 | 11/2018 | Hasegawa et al. |
| 2018/0358397 A1 | 12/2018 | Huang et al. |
| 2019/0157324 A1 | 5/2019 | Watanabe et al. |
| 2019/0319055 A1 | 10/2019 | Zaizen et al. |
| 2019/0371844 A1 | 12/2019 | Furukawa et al. |
| 2019/0386053 A1 | 12/2019 | Amano |
| 2021/0136309 A1* | 5/2021 | Koga ..................... H04N 25/76 |
| 2021/0183924 A1* | 6/2021 | Manda .............. H01L 27/14694 |

FOREIGN PATENT DOCUMENTS

| | | |
|---|---|---|
| JP | 2012-054353 A | 3/2012 |
| JP | 2012-204403 A | 10/2012 |
| JP | 2014-036092 A | 2/2014 |
| JP | 2014-099582 A | 5/2014 |

OTHER PUBLICATIONS

International Preliminary Report on Patentability of PCT Application No. PCT/JP2019/008589, issued on Oct. 22, 2020, 09 pages of English Translation and 05 pages of IPRP.

Notice of Allowance for U.S. Appl. No. 17/044,460, issued on Aug. 24, 2022, 10 pages.

* cited by examiner

[FIG. 1A]
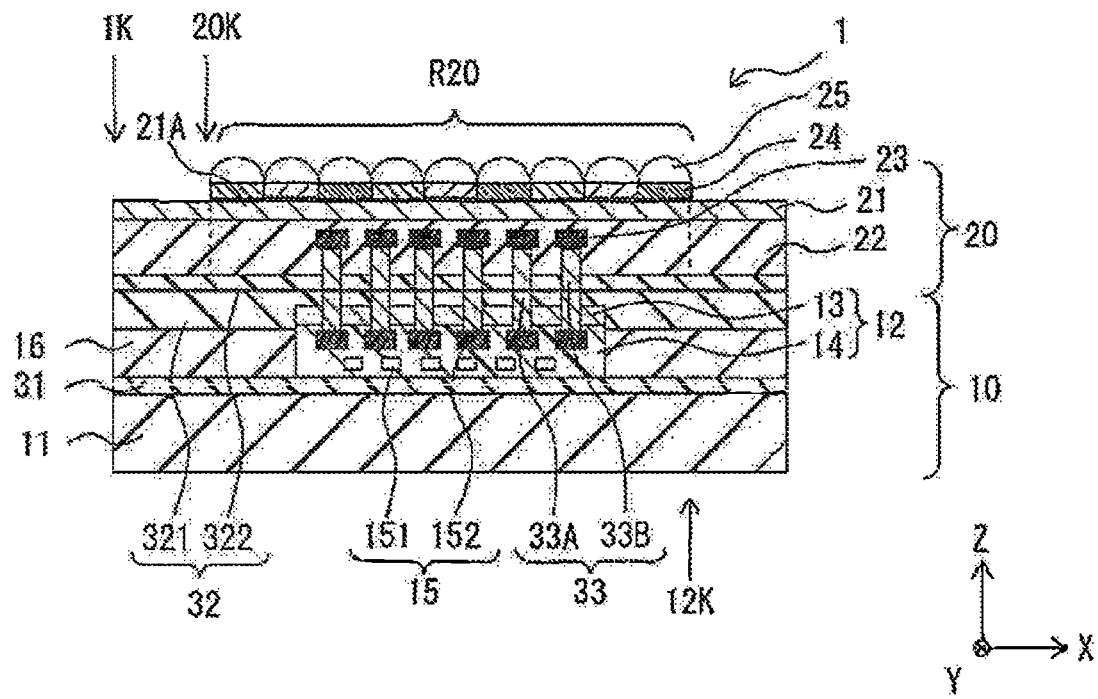
[FIG. 1B]
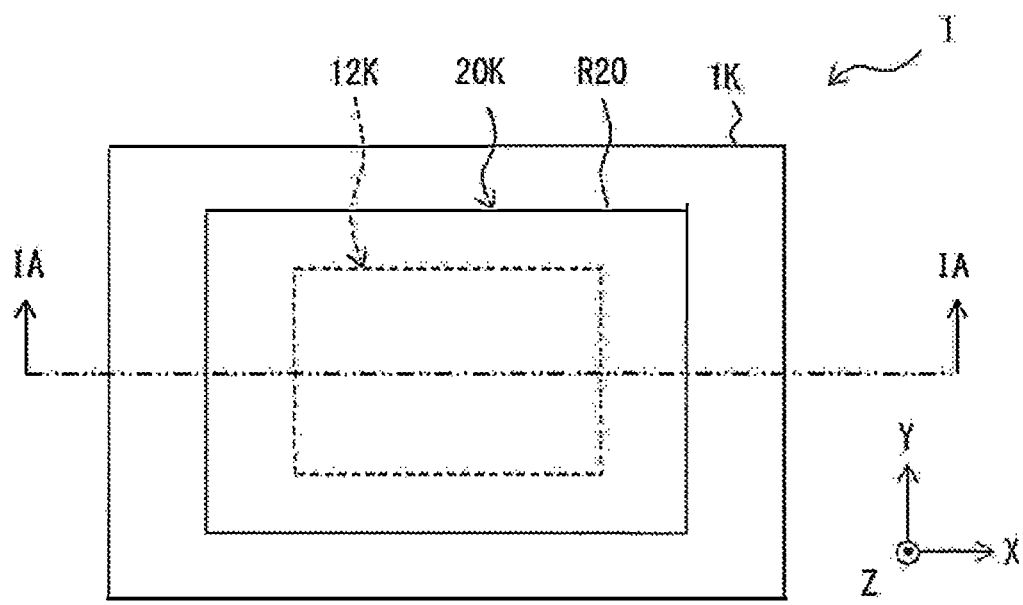

[FIG. 1C]
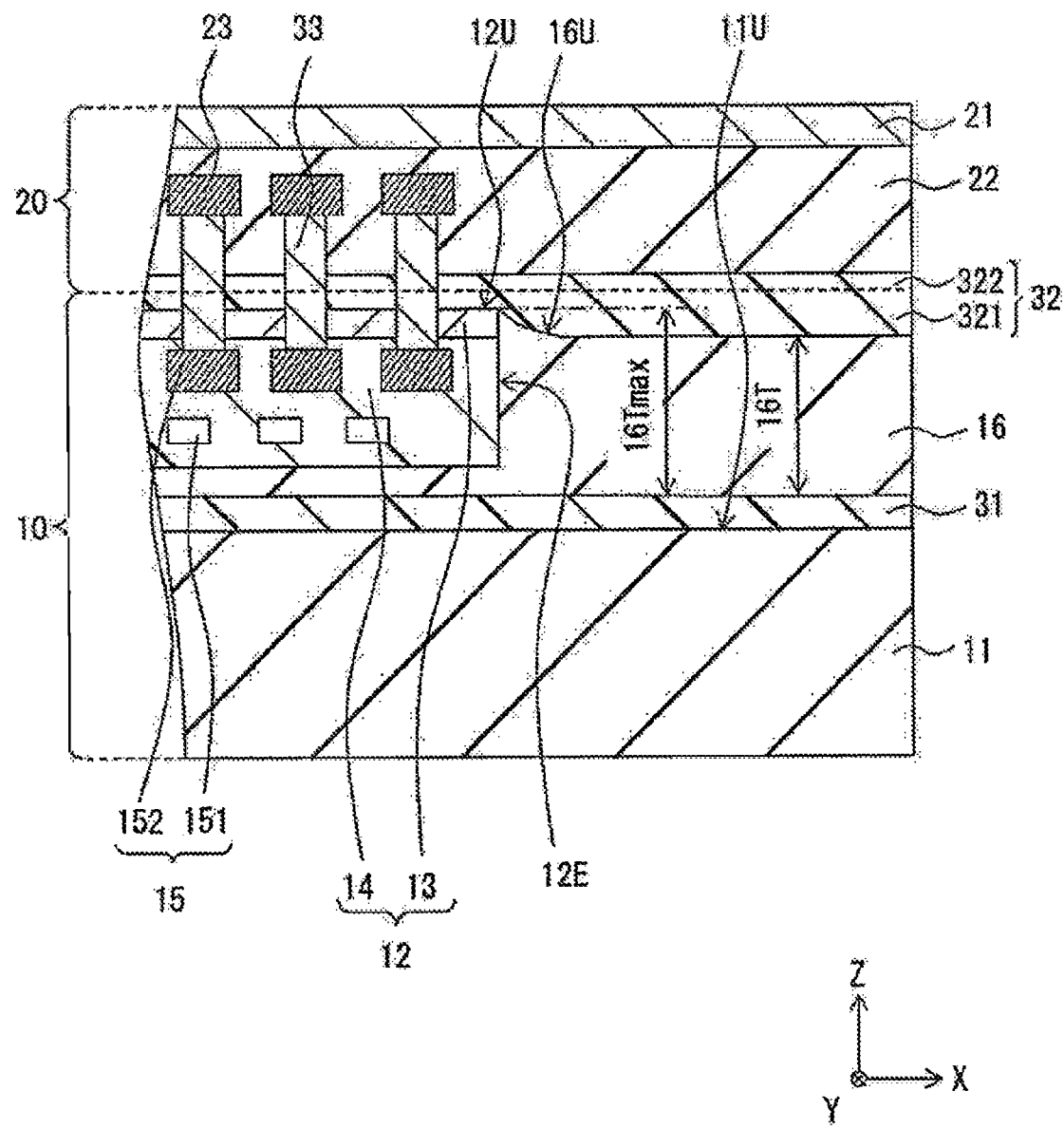

[FIG. 2A]
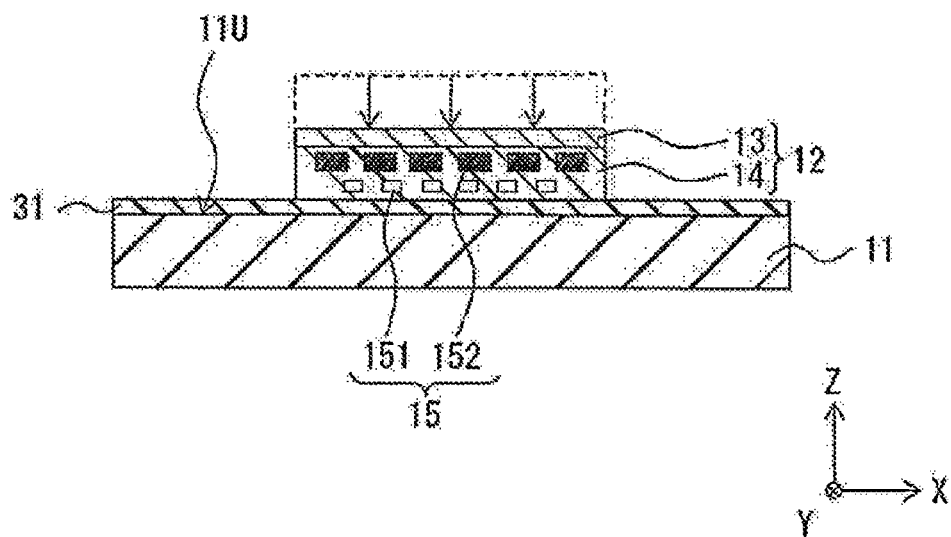
[FIG. 2B]
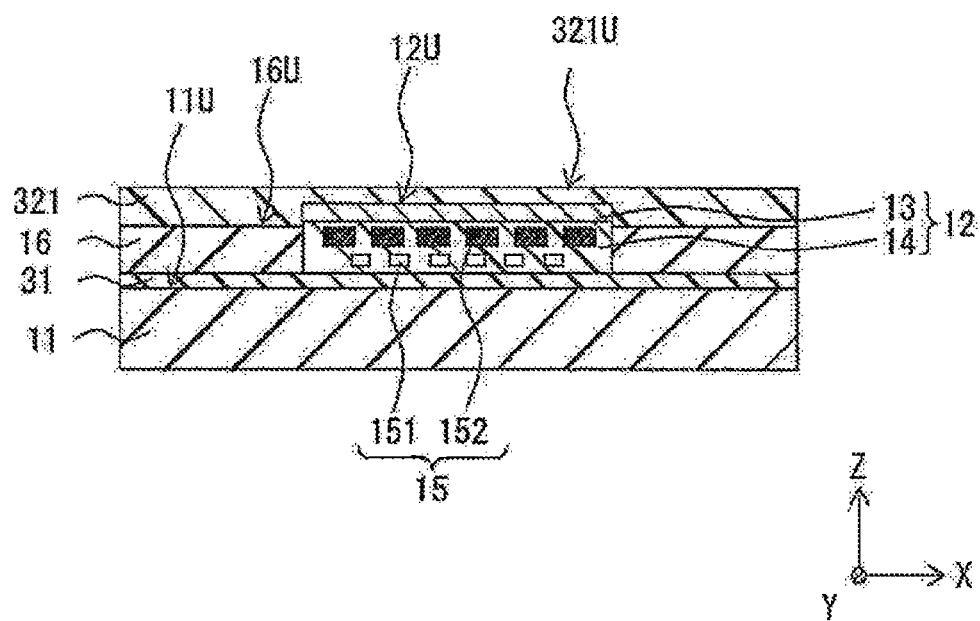

[FIG. 2C]
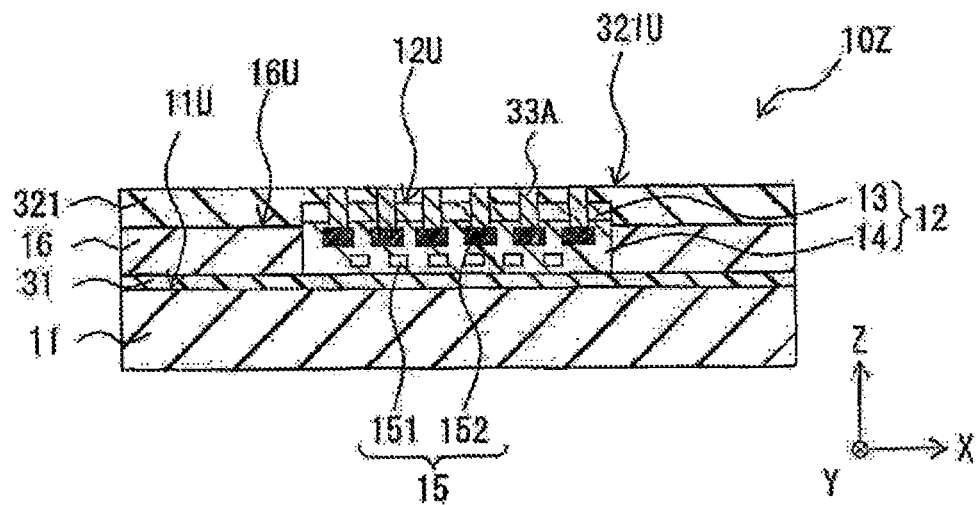
[FIG. 2D]
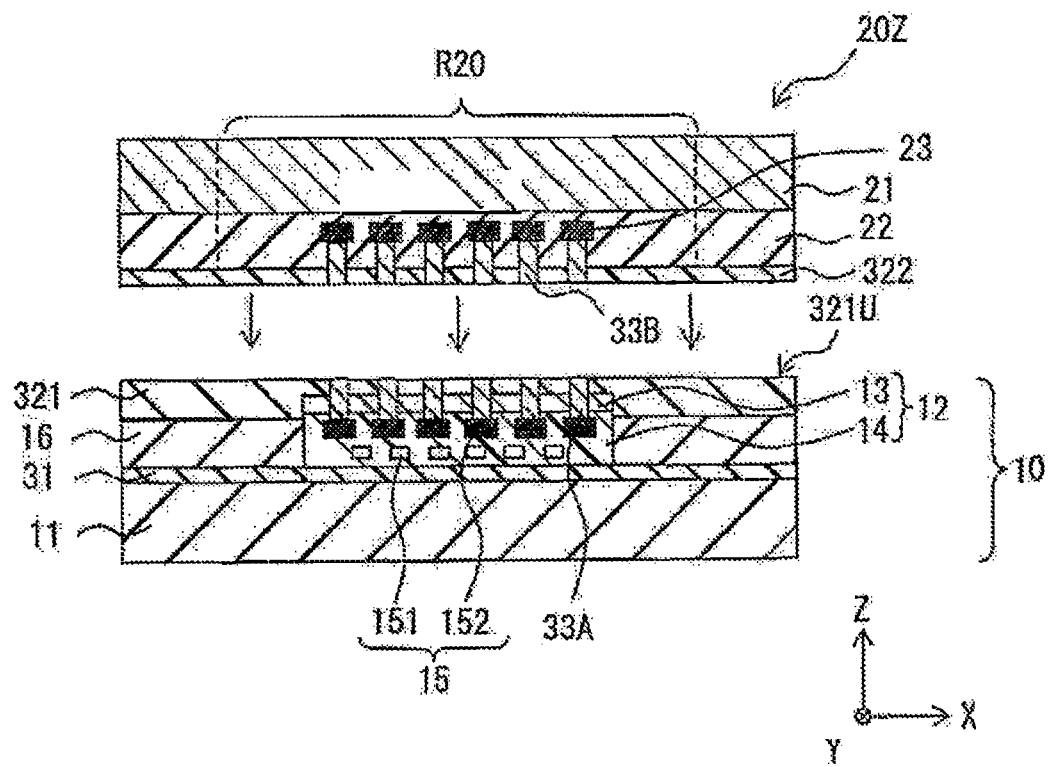

[FIG. 2E]
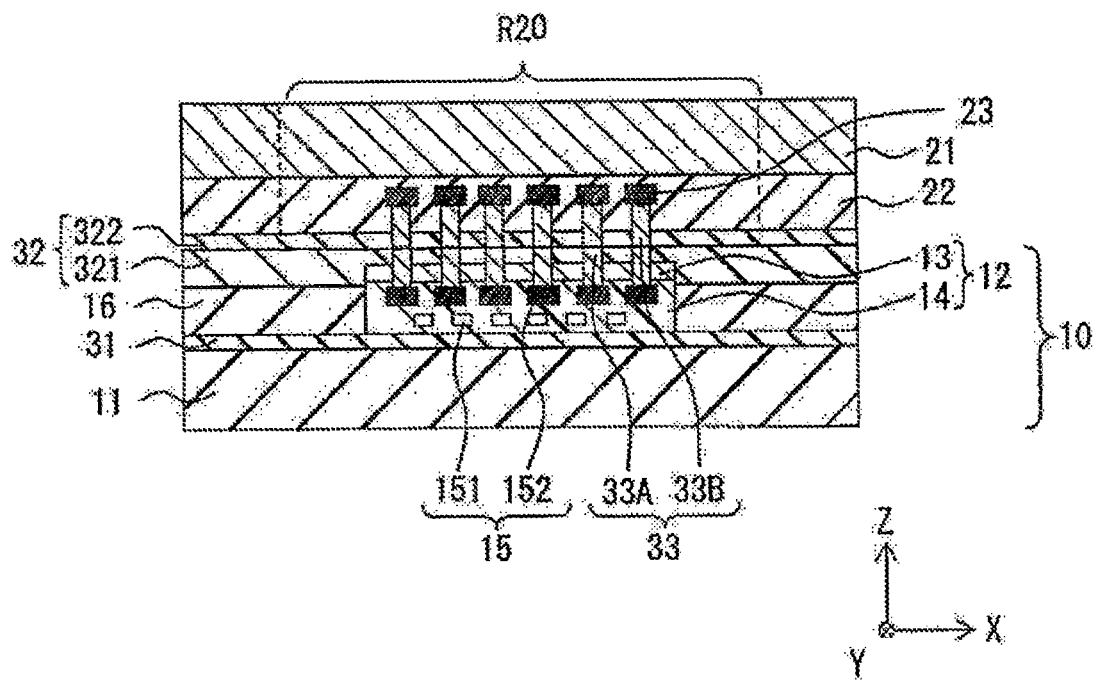
[FIG. 2F]
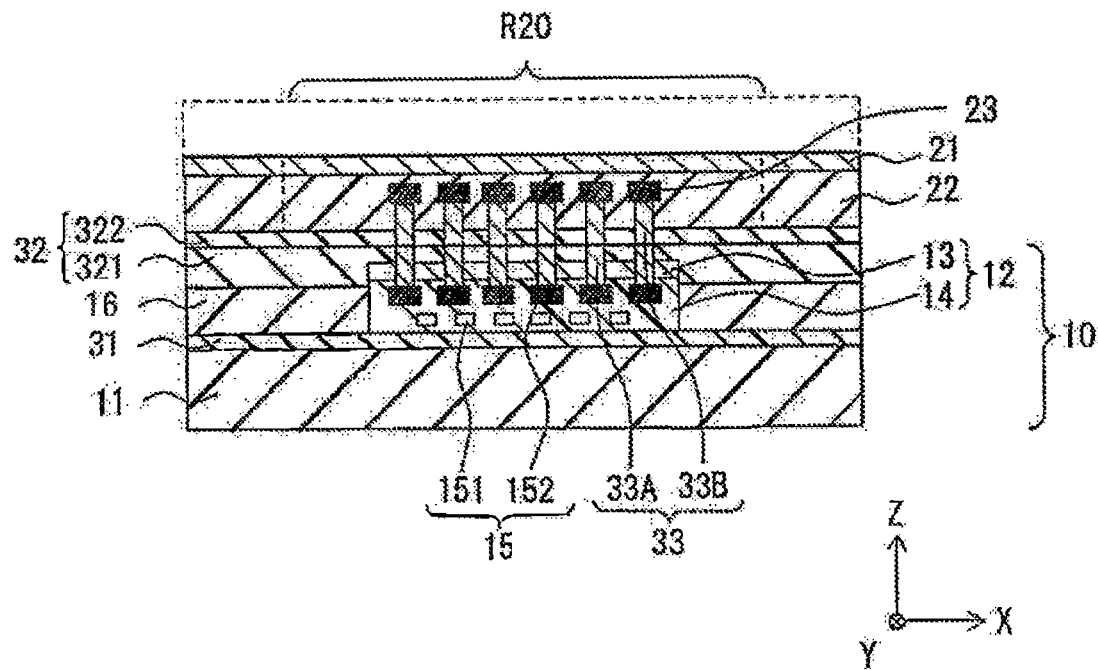

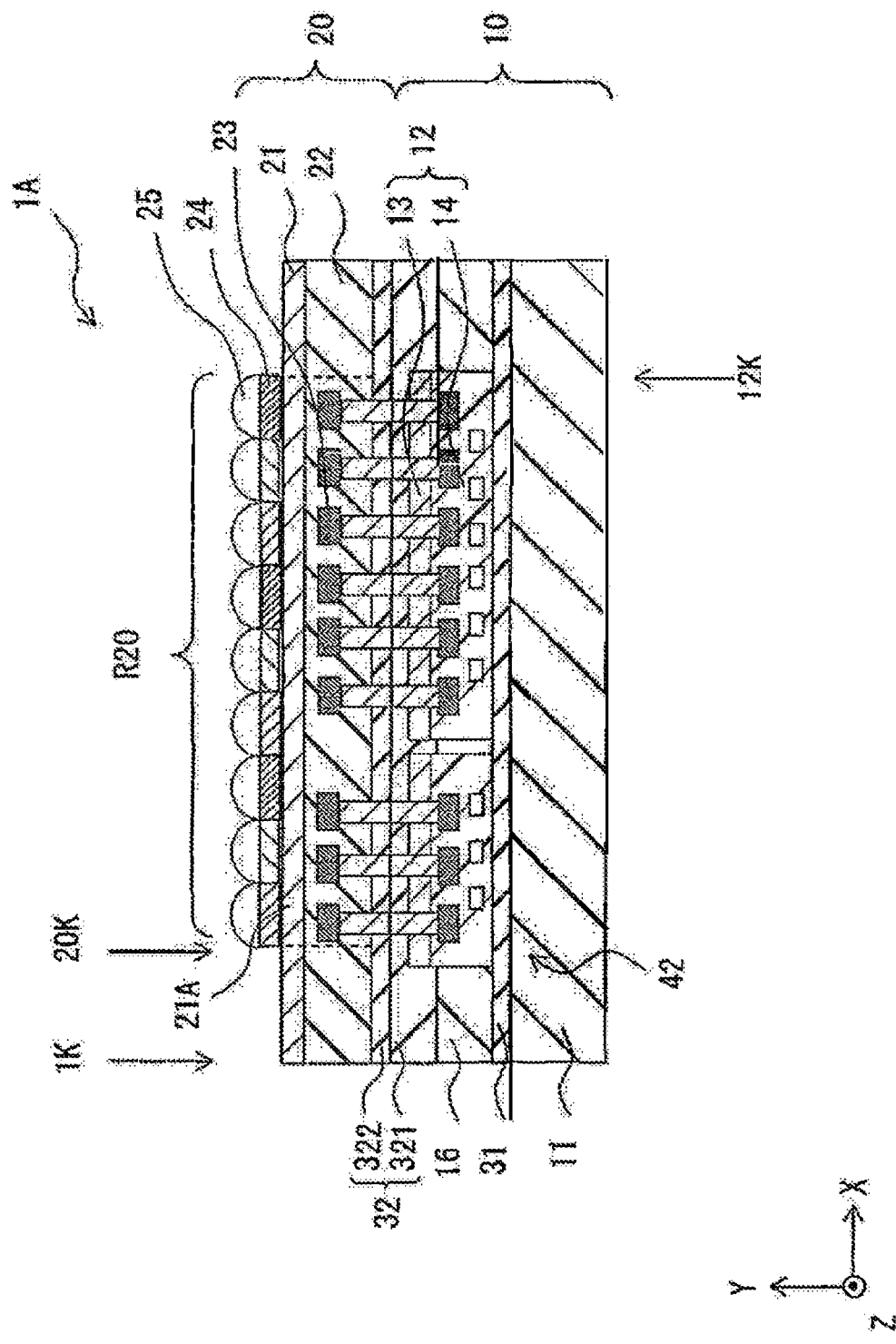
[FIG. 3]

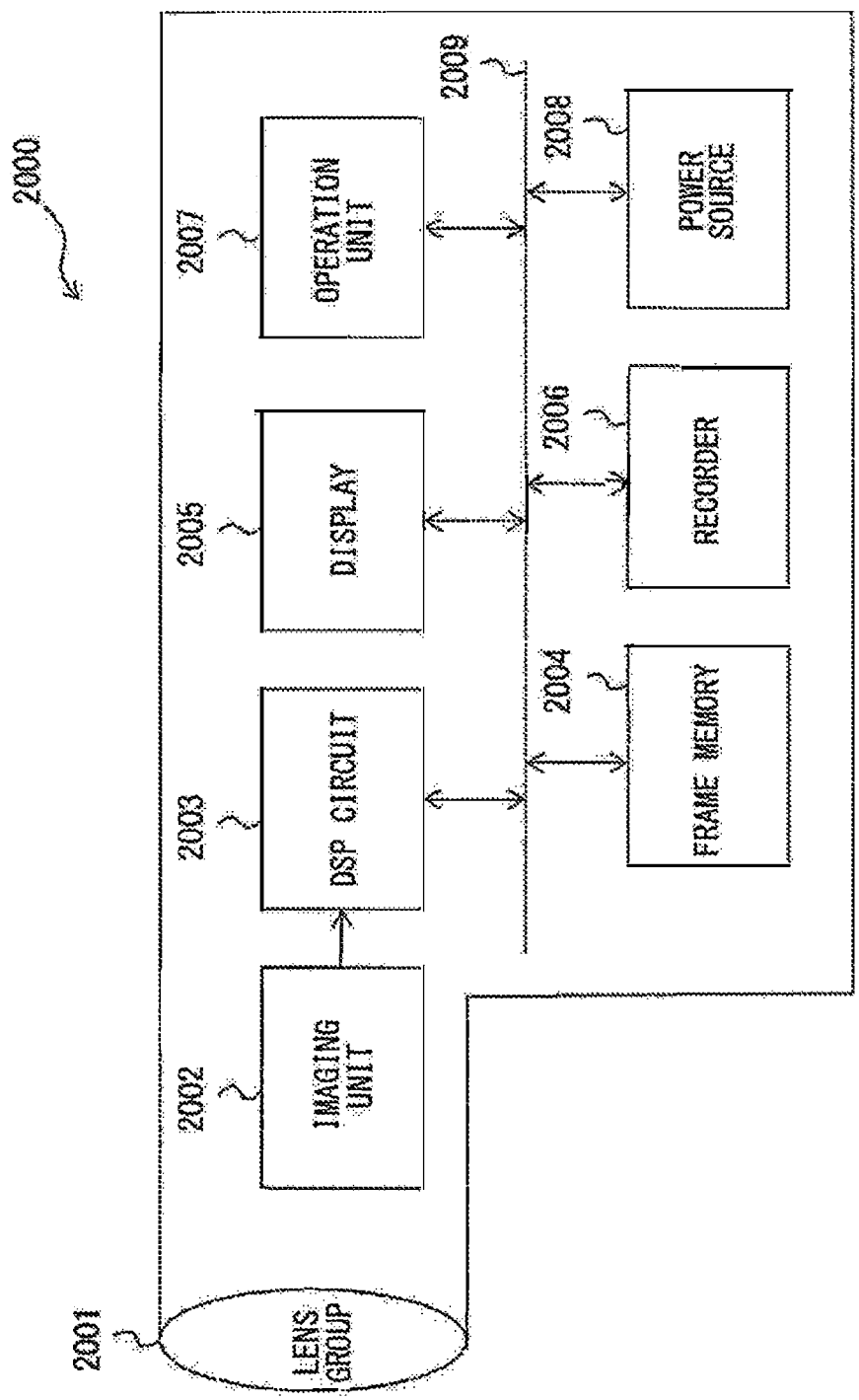
[FIG. 4]

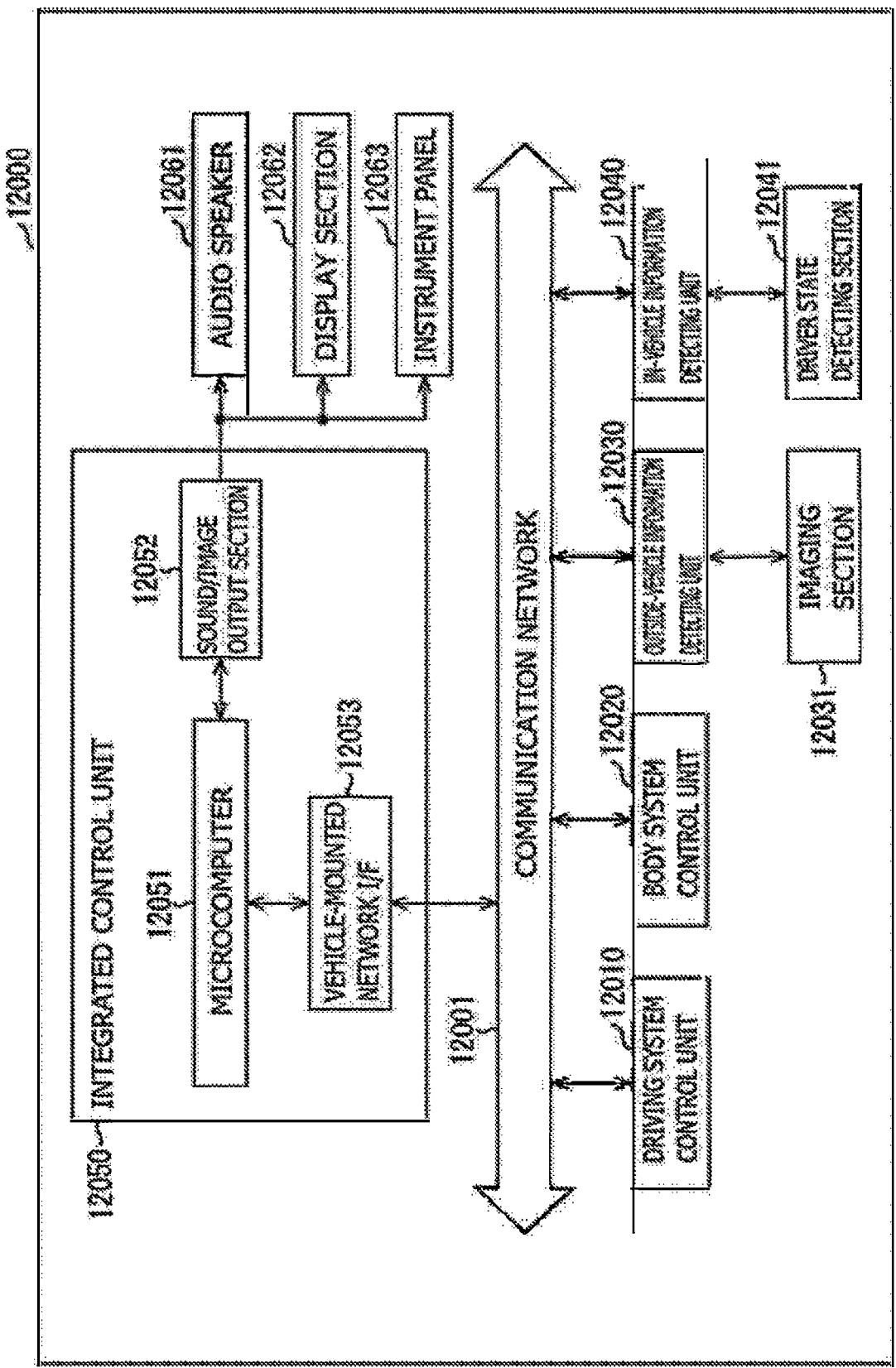
[FIG. 5]

[FIG. 6]
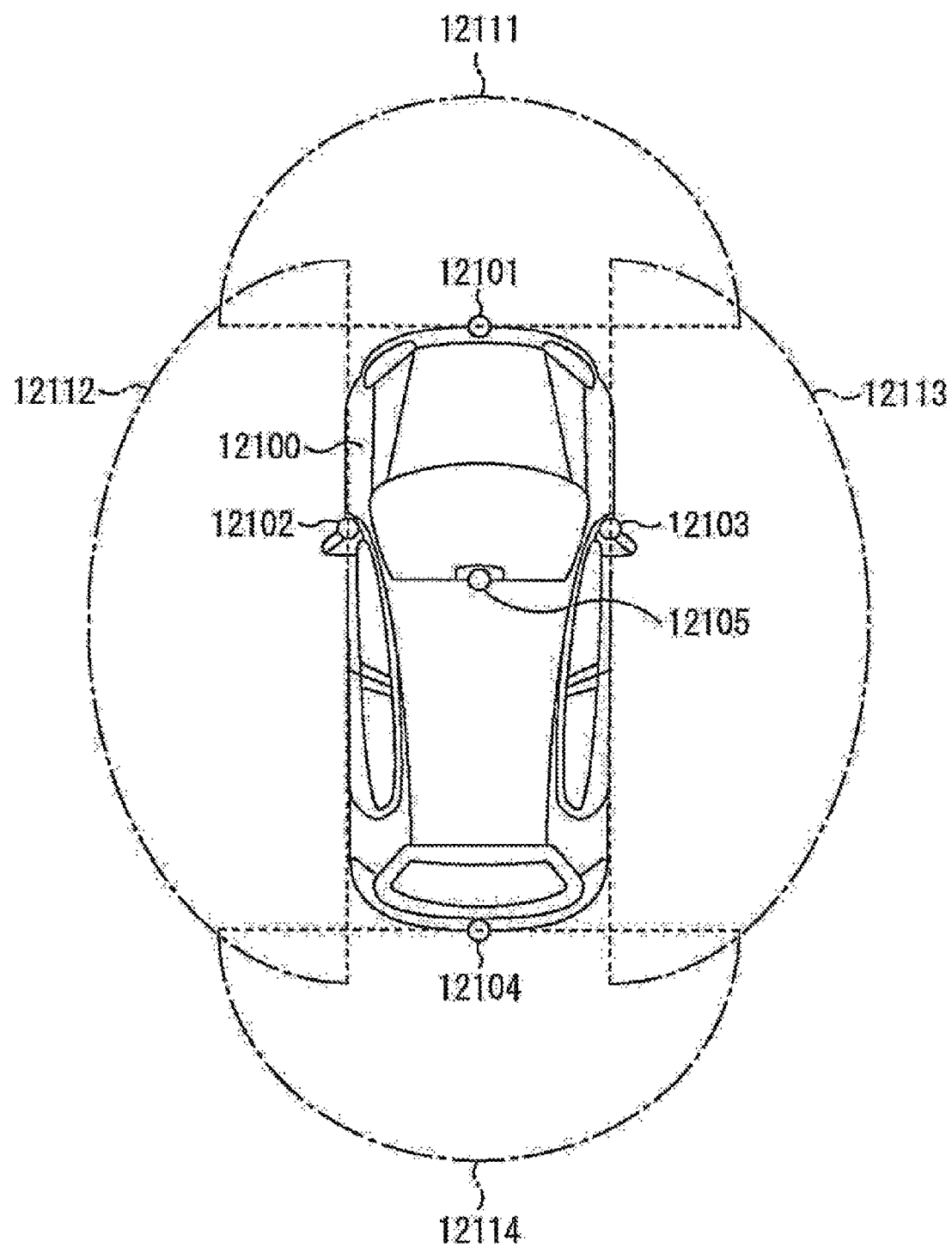

IMAGING UNIT, METHOD FOR MANUFACTURING THE SAME, AND ELECTRONIC APPARATUS

CROSS REFERENCE TO RELATED APPLICATIONS

This application is a continuation application of U.S. patent application Ser. No. 17/044,460, filed on Oct. 1, 2020, which is a U.S. National Phase of International Patent Application No. PCT/JP2019/008589 filed on Mar. 5, 2019, which claims priority benefit of Japanese Patent Application No. JP 2018-074755 filed in the Japan Patent Office on Apr. 9, 2018. Each of the above-referenced applications is hereby incorporated herein by reference in its entirety.

TECHNICAL FIELD

The present disclosure relates to an imaging unit including an imaging device, a method for manufacturing the same, and an electronic apparatus including the same.

BACKGROUND ART

In order to reduce the size of an imaging unit, a WoW (Wafer on Wafer) stacking technique has been proposed so far in which a wafer including an imaging device that generates a pixel signal is bonded to a wafer including, e.g., a memory circuit and a signal processing circuit that performs signal processing for the pixel signal generated in the imaging device (for example, PTL 1).

CITATION LIST

Patent Literature

PTL 1: Japanese Unexamined Patent Application Publication No. 2014-099582

SUMMARY OF THE INVENTION

Meanwhile, such an imaging unit is desired to have an improved imaging performance.

Therefore, it is desirable to provide an imaging unit that is more efficiently manufacturable with high dimensional precision, a method for manufacturing such an imaging unit, and an electronic apparatus including such an imaging unit.

An imaging unit according to one embodiment of the present disclosure includes: a sensor board including an imaging device, in which the imaging device has a plurality of pixels and allows generation of a pixel signal by receiving outside light in each of the plurality of pixels; a bonding film including an inorganic insulating material; a circuit board bonded to the sensor board through the bonding film and including a signal processing circuit that performs signal processing for the pixel signal; and an organic insulating layer that covers the vicinity of the circuit board.

An electronic apparatus according to one embodiment of the present disclosure includes the above imaging unit.

A method for manufacturing an imaging unit according to one embodiment of the present disclosure includes: disposing, above a support substrate, a circuit board having a signal processing circuit, in which the signal processing circuit performs signal processing for a pixel signal; forming an organic insulating film above the support substrate to allow the organic insulating film to cover the vicinity of the circuit board; forming a bonding film using an inorganic material to allow the bonding film to cover the circuit board and the organic insulating film; and bonding a sensor board to the circuit board through the bonding film. The sensor board includes an imaging device. The imaging device has a plurality of pixels and allows generation of a pixel signal by receiving outside light in each of the plurality of pixels.

The imaging unit, the method for manufacturing the imaging unit, and the electronic apparatus according to one embodiment of the present disclosure make it possible to reduce warpage and distortion of the entire imaging unit, thereby reliably achieving high dimensional precision. In addition, it becomes possible to more efficiently manufacture the unit.

It is to be noted that effects of the present disclosure are not necessarily limited to the effects described above, and may include any of effects that are described herein.

BRIEF DESCRIPTION OF DRAWING

FIG. 1A is a cross-sectional view of an example of the overall configuration of a solid-state imaging unit according to a first embodiment of the present disclosure.

FIG. 1B is a plan view of the example of the overall configuration of the solid-state imaging unit illustrated in FIG. 1A.

FIG. 1C is an enlarged cross-sectional view of a main portion of the solid-state imaging unit illustrated in FIG. 1A.

FIG. 2A is a cross-sectional view of one process step in a method for manufacturing the solid-state imaging unit illustrated in FIG. 1A.

FIG. 2B is a cross-sectional view of one process step subsequent to the process step in FIG. 2A.

FIG. 2C is a cross-sectional view of one process step subsequent to the process step in FIG. 2B.

FIG. 2D is a cross-sectional view of one process step subsequent to the process step in FIG. 2C.

FIG. 2E is a cross-sectional view of one process step subsequent to the process step in FIG. 2D.

FIG. 2F is a cross-sectional view of one process step subsequent to the process step in FIG. 2E.

FIG. 3 is a cross-sectional view of an example of the overall configuration of a solid-state imaging unit according to a first modification example of the present disclosure.

FIG. 4 is a schematic diagram illustrating an example of the overall configuration of an electronic apparatus according to a second embodiment of the present disclosure.

FIG. 5 is a block diagram depicting an example of schematic configuration of a vehicle control system.

FIG. 6 is a diagram of assistance in explaining an example of installation positions of an outside-vehicle information detecting section and an imaging section.

MODES FOR CARRYING OUT THE INVENTION

Hereinafter, embodiments of the present disclosure will be described in detail with reference to the drawings. It should be noted that the description is given in the following order.

1. First Embodiment (An example of a solid-state imaging unit having a two-layer structure)
2. Modification Example of First Embodiment (An example of the solid-state imaging unit having a two-layer structure of a sensor board and a plurality of circuit boards disposed in the same level)
3. Second Embodiment (An application example to an electronic apparatus)

4. Application Examples to Mobile Bodies
5. Other Modification Examples

1. First Embodiment

[Configuration of Solid-State Imaging Unit 1]

FIGS. 1A and 1B each schematically illustrate an example of the overall configuration of a solid-state imaging unit 1 according to a first embodiment of the present disclosure. FIG. 1A illustrates an example of a cross-sectional configuration of the solid-state imaging unit 1, and FIG. 1B illustrates an example of a plane configuration of the solid-state imaging unit 1. FIG. 1A corresponds to a cross-sectional view along a cut line IA-IA illustrated in FIG. 1B as viewed in an arrow direction.

The solid-state imaging unit 1 has a two-layer structure including a circuit board 10 and a sensor board 20. In the present embodiment, a direction in which the circuit board 10 and the sensor board 20 are laminated is referred to as a z-axis direction, and a plane on which the circuit board 10 and the sensor board 20 spread is referred to as an XY plane. In FIGS. 1A and 1B, the reference sign 1K indicates the outer edge of the solid-state imaging unit 1. The outer edge 1K of the solid-state imaging unit 1 is coincident with the outermost edge of the circuit board 10 and the outermost edge of the sensor board 20.

(Circuit Board 10)

The circuit board 10 includes a support substrate 11 and a logic chip 12 disposed above the support substrate 11. The logic chip 12 is one specific example corresponding to a "circuit chip" of the present disclosure. The support substrate 11 is disposed adjacent to the side opposite to the sensor board 20 when viewed from the logic chip 12, and supports the logic chip 12. The logic chip 12 has a thickness of, e.g., 5 µm or more. The vicinity of the logic chip 12 is covered with an organic insulating layer 16 including a heat-resistant resin such as polyimide. The organic insulating layer 16 may be formed by a coating method such as a spin-coating method. The support substrate 11 and the organic insulating layer 16 are bonded together through, e.g., an oxide bonding layer 31. The logic chip 12 has a signal processing circuit that performs signal processing for a pixel signal from a solid-state imaging device 21A, which will be described later. FIGS. 1A and 1B exemplify a logic circuit 15 as a signal processing circuit. Further, the logic chip 12 has a structure in which a circuit forming layer 14 and a semiconductor substrate 13 are laminated in the lamination direction (the z-axis direction). The circuit forming layer 14 is provided with the logic circuit 15. The logic circuit 15 includes a semiconductor device 151 such as a transistor and a wiring line 152. Further, the uppermost layer of the circuit board 10 is provided with an inorganic insulating layer 321 covering the logic chip 12 and the organic insulating layer 16. The inorganic insulating layer 321 includes an inorganic oxide such as silicon oxide (SiOx) or silicon nitride (SiNx). The inorganic insulating layer 321 is formed by a gas phase method such as a CVD (chemical vapor deposition) method. The inorganic insulating layer 321 integrates with an inorganic insulating layer 322 which will be described later to form an oxide bonding layer 32.

As illustrated in the enlarged cross-sectional view of a main portion of FIG. 1C, the height position of the upper surface 16U of the organic insulating layer 16 is lower than that of the upper surface 12U of the logic chip 12, for example. The height position described here refers to a position in the z-axis direction that is the lamination direction with reference to, e.g., the upper surface 11U of the support substrate 11 as a reference position. The organic insulating layer 16 has a thickness 16T that is maximum at a position in contact with an edge surface 12E of the logic chip 12 (the thickness at that position is referred to as a thickness 16Tmax) and that is decreased with an increasing distance from the edge surface 12E of the logic chip 12. If the organic insulating layer 16 is formed by a spin-coating method, the organic insulating layer 16 often has such a cross-sectional shape.

(Sensor Board 20)

The sensor board 20 has a structure in which a wiring-line layer 22 is laminated on an device forming layer 21 including the solid-state imaging device 21A, and includes an effective pixel region R20 provided with the solid-state imaging device 21A on the XY plane. The effective pixel region R20 refers to a region inside, e.g., an optical black region (OPB), that is, a region where it is possible to receive outside light. The solid-state imaging device 21A includes a plurality of pixels including photodiodes, and allows generation of a pixel signal by receiving outside light on a pixel basis. The wiring-line layer 22 is provided with a terminal portion 23 that electrically couples the solid-state imaging device 21A to the wiring line 152 of the logic circuit 15 in the circuit board 10, for example. The sensor board 20 further includes a plurality of color filters 24 and a plurality of on-chip lenses 25 which are laminated on or above the device forming layer 21. In addition, the lowermost layer of the sensor board 20 is provided with an inorganic insulating layer 322 covering a surface of the wiring-line layer 22 opposite to the device forming layer 21. The inorganic insulating layer 322 includes an inorganic oxide such as silicon oxide or silicon nitride. The inorganic insulating layer 322 integrates with the inorganic insulating layer 321 in the circuit board 10 to form the oxide bonding layer 32. Thus, the oxide bonding layer 32 bonds the sensor board 20 and the circuit board 10 together. The terminal portion 23 is coupled to the wiring line 152 through a contact plug 33 extending in the z-axis direction. The contact plug 33 is a wiring line that electrically couples the solid-state imaging device 21A to the logic circuit 15, and penetrates the wiring-line layer 22, the oxide bonding layer 32, the semiconductor substrate 13, and the circuit forming layer 14. It is to be noted that the oxide bonding layer 32 is one specific example corresponding to the "bonding layer" of the present disclosure.

[Method for Manufacturing Solid-State Imaging Unit 1]

Subsequently, a method for manufacturing the solid-state imaging unit 1 will be described with reference to FIGS. 2A, 2B, 2C, 2D, 2E, and 2F. Each of FIGS. 2A, 2B, 2C, 2D, 2E, and 2F is a cross-sectional view of one process step of the method for manufacturing the solid-state imaging unit 1, and corresponds to FIG. 1A.

First, as illustrated in FIG. 2A, the support substrate 11 and the logic chip 12 are prepared, following which the logic chip 12 is bonded to the support substrate 11 by oxide bonding, for example. The oxide bonding layer 31 is formed in the interface between the support substrate 11 and the logic chip 12. The semiconductor substrate 13 of the logic chip 12 may have a thickness that is made thin enough not to substantially affect a function of the logic chip 12.

Subsequently, as illustrated in FIG. 2B, the organic insulating layer 16 is formed around the logic chip 12 above the support substrate 11 by a coating method such as a spin-coating method so as to cover the upper surface 11U of the support substrate 11. At that time, the height position of the upper surface 16U of the organic insulating layer 16 may be lower than that of the upper surface 12U of the logic chip 12.

That is to say, the thickness of the organic insulating layer 16 may be thinner than that of the logic chip 12. After the formation of the organic insulating layer 16, the organic insulating layer 16 may be subjected to, e.g., annealing to be hardened. Further, the inorganic insulating layer 321 is formed by a gas phase method such as a CVD method so as to cover the organic insulating layer 16 and the logic chip 12. After the formation of the inorganic insulating layer 321, the upper surface 321U of the inorganic insulating layer 321 is flattened.

Subsequently, as illustrated in FIG. 2C, a contact plug 33A is formed to electrically couple the solid-state imaging device 21A in the sensor board 20 to the wiring line 152 in the circuit board 10. At that time, the lower end of the contact plug 33A is coupled to the wiring line 152, and the upper end of the contact plug 33A is exposed to the upper surface 321U of the inorganic insulating layer 321.

Next, as illustrated in FIG. 2D, a structure body 20Z is prepared. The structure body 20Z has a structure in which the wiring-line layer 22 is laminated on the device forming layer 21 including the solid-state imaging device 21A. The wiring-line layer 22 embeds the terminal portion 23 therein, and is provided with a contact plug 33B having an upper end coupled to the terminal portion 23. The lower end of the contact plug 33B is exposed to the surface of the wiring-line layer 22. Here, positions of the structure body 20Z and the circuit board 10 are adjusted on the XY plane with the surface of the wiring-line layer 22 in the structure body 20Z opposing the planarized, upper surface 321U of the inorganic insulating layer 321 in the circuit board 10.

After the position adjustment of the structure body 20Z and the circuit board 10 on the XY plane, the structure body 20Z and the circuit board 10 are bonded together as illustrated in FIG. 2E. Here, the upper end of contact plug 33A provided to the circuit board 10 and the lower end of the contact plug 33B provided to the structure body 20Z are bonded together by, e.g., Cu—Cu bonding to form the contact plug 33.

Next, as illustrated in FIG. 2F, the device forming layer 21 is made thin. Finally, the plurality of color filters 24 and the plurality of on-chip lenses 25 are laminated on or above the device forming layer 21 thinned, thereby forming the sensor board 20 (see FIG. 1A). This completes formation of the solid-state imaging unit 1.

[Workings and Effects of Solid-State Imaging Unit 1]

As described above, according to the solid-state imaging unit 1 in the present embodiment, the organic insulating layer 16 covers the vicinity of the logic chip 12 above the support substrate 11 in the circuit board 10. This improves productivity, compared with a case where the vicinity of the logic chip 12 is filled with an inorganic insulating layer.

In addition, in the solid-state imaging unit 1, the organic insulating layer 16 is formed by a coating method. This makes it possible to further improve flatness on the upper surface 321U of the inorganic insulating layer 321. For example, in a case where an inorganic insulating film is formed by a gas phase method using only an inorganic material so as to cover the whole, irregularities are prone to appear on the upper surface of the inorganic insulating film due to an underlying step, i.e., the height difference between the upper surface 11U of the support substrate 11 and the upper surface 12U of the logic chip 12. In contrast, as in the present embodiment, forming the organic insulating layer 16 in only a flat underlying surface around the logic chip 12, i.e., only a region corresponding to the upper surface 11U of the support substrate 11 by a coating method also enables relatively high flatness on the upper surface 16U of the organic insulating layer 16. This makes it possible to improve the flatness on the upper surface 321U of the inorganic insulating layer 321 serving as a bonding surface bonded to the sensor board 20. In particular, if the logic chip 12 has a thickness of 5 μm or more, adopting the organic insulating layer 16 formed by the coating method is significantly more advantageous than adopting only the inorganic material layer formed by a gas phase method. In addition, the organic insulating layer 16 includes a heat-resistant resin such as polyimide, thus making it possible to bond the upper end of the contact plug 33A to the lower end of the contact plug 33B by the Cu—Cu bonding.

Further, in the solid-state imaging unit 1, the circuit board 10 and the sensor board 20 are bonded together by bonding the inorganic insulating layer 321 and the inorganic insulating layer 322 together by, e.g., Cu—Cu connection. This enables a more precise bonding structure. In contrast, for example, in a case where a resin insulating layer is used for a bonding surface, the flatness on the surface of the resin insulating layer often tends to be inferior to that on the surface of an inorganic insulating layer. In addition, it is extremely difficult to form the contact plug 33 that electrically couples the solid-state imaging device 21A to the logic circuit 15 to allow the contact plug 33 to penetrate such a resin insulating layer. In this regard, according to the present embodiment, using high flatness on the surfaces of the inorganic insulating layer 321 and the inorganic insulating layer 322, only a minimum flattening process enables not only a high precision bonding but also relatively easy formation of the contact plug 33.

2. Modification Example of First Embodiment

[Configuration of Solid-State Imaging Unit 1A]

FIG. 3 is a cross-sectional view of an example of the overall configuration of a solid-state imaging unit 1A according to a first modification example (hereinafter referred to as a modification example 1) of the present disclosure, and corresponds to FIG. 1A illustrating the solid-state imaging unit 1 of the above first embodiment.

As illustrated in FIG. 3, in the solid-state imaging unit 1A according to the modification example 1, another circuit chip, specifically, a memory chip 42 is disposed above the support substrate 11 so as to be adjacent to the logic chip 12. In the solid-state imaging unit 1A, the organic insulating layer 16 is formed by, e.g., a coating or immersion method so as to fill the vicinity of the logic chip 12 and the vicinity of the memory chip 42. Except this point, the solid-state imaging unit 1A has a similar configuration to the solid-state imaging unit 1 of the above embodiment.

[Workings and Effects of Solid-State Imaging Unit 1A]

As can be seen, the solid-state imaging unit 1A of the modification example 1 also has the configuration in which the organic insulating layer 16 covers the vicinity of the logic chip 12 and the vicinity of the memory chip 42 which are above the support substrate 11 in the circuit board 10. Therefore, as with the solid-state imaging unit 1 of the above embodiment, productivity is improved compared with a case where the vicinity of the logic chip 12 and the vicinity of the memory chip 42 are filled with an inorganic insulating layer. In addition, it is possible to improve flatness on the upper surface 321U of the inorganic insulating layer 321 serving as a bonding surface bonded to the sensor board 20. In particular, if the difference between the height position of the upper surface 12U of the logic chip 12 and the height position of the upper surface 42U of the logic chip 42 is 5 μm or more, adopting the organic insulating layer 16 formed by the coating method is significantly more advantageous than adopting only the inorganic material layer formed by a gas phase method. Other workings and effects in the solid-state imaging unit 1A are also similar to those in the solid-state imaging unit 1.

3. Second Embodiment: Application Example to Electronic Apparatus

FIG. 4 is a block diagram illustrating a configuration example of a camera 2000 serving as an electronic apparatus to which the present technology is applied.

The camera 2000 includes: an optical unit 2001 including, e.g., a lens group; an imaging unit (an imaging device) 2002 to which, e.g., the above-described solid-state imaging unit 1 or 1A (hereinafter referred to as the solid-state imaging unit 1 or the like) is applied; and a DSP (Digital Signal Processor) circuit 2003 which is a camera signal processing circuit. In addition, the camera apparatus 2000 further includes a frame memory 2004, a display 2005, a recorder 2006, an operation unit 2007, and a power source 2008. The DSP circuit 2003, the frame memory 2004, the display 2005, the recorder 2006, the operation unit 2007, and the power source 2008 are connected to one another via a bus line 2009.

The optical unit 2001 forms an image on an imaging surface of the imaging unit 2002 by taking incident light (image light) from a subject. The imaging unit 2002 converts a light amount of the incident light imaged on the imaging surface by the optical unit 2001 into an electric signal on a pixel basis, and outputs the converted electric signal as a pixel signal.

The display 2005 is, for example, a panel-type display apparatus such as a liquid crystal panel or an organic EL panel, and displays a moving image or a still image imaged by the imaging unit 2002. The recorder 2006 records a moving image or a still image imaged by the imaging unit 2002 on a recording medium such as a hard disk or a semiconductor memory.

The operation unit 2007 issues an operation command for various functions of the imaging unit 2000 under an operation of a user. The power source 2008 supplies, on an as-necessary basis, various types of power supplies which are operation power supplies of the DSP circuit 2003, the frame memory 2004, the display 2005, the recorder 2006, and the operation unit 2007 to these supply targets.

As described above, use of the above-described solid-state imaging unit 1 or the like as the imaging unit 2002 makes it possible to expect obtaining an excellent image.

4. Application Examples to Mobile Bodies

The technique according to the present disclosure (the present technology) may be applied to diverse products. For example, the technique according to the present disclosure may be implemented as an apparatus to be mounted on any type of mobile bodies such as automobiles, electric vehicles, hybrid electric vehicles, motorcycles, bicycles, personal mobility devices, aircraft, drones, ships, and robots.

FIG. 5 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 5, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 5, an audio speaker 12061, a display section 12062, and an instrument panel 12063 are illustrated as the output device. The display section 12062 may, for example, include at least one of an on-board display and a head-up display.

FIG. 6 is a diagram depicting an example of the installation position of the imaging section 12031.

In FIG. 6, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 6 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technique according to the present disclosure may be applied is explained above. The technique according to the present disclosure may be applied to the imaging section 12031 among the components discussed above. Specifically, for example, the solid-state imaging unit 1 illustrated in, e.g., FIG. 1A may be adopted as the imaging section 12031. Applying the technique according to the present disclosure to the imaging section 12031 may excellently operate a vehicle control system.

5. Other Modification Examples

As above, the present disclosure is described with reference to some embodiments and the modification example. However, the present disclosure is not limited to the foregoing embodiments and the modification example, and various modifications are possible. For example, the above embodiments exemplify the solid-state imaging unit 1 having a two-layer structure of the circuit board 10 and the sensor board 20. However, the present disclosure is not limited thereto. The present disclosure is applicable to, e.g., a three- or more-layer structure. Further, according to the above modification example, two circuit chips are disposed in the same level, and the vicinity thereof is filled with the organic insulating layer. However, the present disclosure is not limited thereto, and three or more circuit chips may be arranged above the support substrate.

In addition, the individual elements of the circuit board 10 and of the sensor board 20 described in the above embodiments and the modification example may have any arrangement positions, dimensions, and shapes.

For example, the above embodiments and the modification example exemplify the logic chip and the memory circuit as the signal processing circuit. However, the present disclosure is not limited thereto. For example, the signal processing circuit of the present disclosure includes at least one of a logic circuit, a memory circuit, a power supply circuit, an image signal compression circuit, a clock circuit, or an optical communication conversion circuit.

It is to be noted that the effects described herein are mere examples and thus are not limiting. Further, other effects may be provided. Moreover, the present technology may have the following configuration.

(1)

An imaging unit including:
  a sensor board including an imaging device, the imaging device having a plurality of pixels and allowing generation of a pixel signal by receiving outside light in each of the plurality of pixels;
  a bonding layer including an inorganic insulating material; and
  a circuit board including a circuit chip and an organic insulating layer, the circuit chip having a signal processing circuit that performs signal processing for the pixel signal and being bonded to the sensor board through the bonding layer, the organic insulating layer covering a vicinity of the circuit chip.

(2)

The imaging unit according to (1), further including a wiring line that passes through the bonding layer to electrically couple the imaging device to the signal processing circuit.

(3)

The imaging unit according to (1) or (2), in which the organic insulating layer is formed by a coating method.

(4)

The imaging unit according to any one of (1) to (3), in which the bonding layer is formed by a gas phase method.

(5)

The imaging unit according to any one of (1) to (4), in which the organic insulating layer includes a heat-resistant resin.

(6)

The imaging unit according to any one of (1) to (5), in which
  the circuit board further includes a support substrate, the support substrate being disposed adjacent to a side opposite to the sensor board when viewed from the circuit chip and supporting the circuit chip, and
  the circuit chip has a thickness of 5 µm or more.

(7)

The imaging unit according to any one of (1) to (6), in which
  the circuit chip includes a first circuit chip and a second circuit chip, and a difference between a height position of an upper surface of the first circuit chip and a height position of an upper surface of the second circuit chip is 5 µm or more.

(8)

The imaging unit according to any one of (1) to (7), in which
  the circuit board further includes a support substrate, the support substrate being disposed adjacent to a side opposite to the sensor board when viewed from the circuit chip and supporting the circuit chip,
  the organic insulating layer is provided to allow the organic insulating layer to cover a vicinity of the circuit chip above the support substrate, and
  a height position of an upper surface of the organic insulating layer is lower than a height position of an upper surface of the circuit chip.

(9)

The imaging unit according to any one of (1) to (8), in which the organic insulating layer has a thickness that is maximum at a position in contact with an edge surface of the circuit chip and that is decreased with an increasing distance from the edge surface of the circuit chip.

(10)

The imaging unit according to any one of (1) to (9), in which the signal processing circuit includes at least one of a logic circuit, a memory circuit, a power supply circuit, an image signal compression circuit, a clock circuit, or an optical communication conversion circuit.

(11)

A method for manufacturing an imaging unit, the method including:
  disposing, above a support substrate, a circuit chip having a signal processing circuit, the signal processing circuit performing signal processing for a pixel signal;
  forming an organic insulating layer above the support substrate to allow the organic insulating layer to cover a vicinity of the circuit chip;

forming a bonding layer using an inorganic insulating material to allow the bonding layer to cover the circuit chip and the organic insulating layer; and bonding a sensor board to the circuit chip through the bonding layer, the sensor board including an imaging device, the imaging device having a plurality of pixels and allowing generation of a pixel signal by receiving outside light in each of the plurality of pixels.

(12)

The method for manufacturing the imaging unit according to (11), in which the method further includes forming a wiring line that passes through the bonding layer to electrically couple the imaging device to the signal processing circuit.

(13)

The method for manufacturing the imaging unit according to (11) or (12), in which the method further includes:

forming a first wiring-line layer that passes through the bonding layer to be joined to the signal processing circuit;

forming, in the sensor board, a second wiring-line layer joined to the imaging device; and bring the first wiring-line layer into contact with the second wiring-line layer upon bonding the sensor board to the circuit chip.

(14)

The method for manufacturing the imaging unit according to any one of (11) to (13), in which the organic insulating layer is formed by a coating method.

(15)

The method for manufacturing the imaging unit according to (14), in which the organic insulating layer formed by the coating method is hardened.

(16)

An electronic apparatus including an imaging unit, the imaging unit including:

a sensor board including an imaging device, the imaging device having a plurality of pixels and allowing generation of a pixel signal by receiving outside light in each of the plurality of pixels;

a bonding layer including an inorganic insulating material; and a circuit board including a circuit chip and an organic insulating layer, the circuit chip having a signal processing circuit that performs signal processing for the pixel signal and being bonded to the sensor board through the bonding layer, the organic insulating layer covering a vicinity of the circuit chip.

This application claims the benefit of Japanese Priority Patent Application JP2018-74755 filed with the Japan Patent Office on Apr. 9, 2018, the entire contents of which are incorporated herein by reference.

It should be understood by those skilled in the art that various modification, combinations, sub-combinations and alterations may occur depending on design requirements and other factors insofar as they are within the scope of the appended claims or the equivalents thereof.

The invention claimed is:

1. An imaging device, comprising:
an upper section that includes a plurality of pixels; and
a lower section that includes a logic chip, a memory chip, and an organic insulating layer, wherein
the logic chip is bonded and electrically connected to the upper section,
the memory chip is bonded and electrically connected to the upper section, and
the logic chip and the memory chip are covered by the organic insulating layer.

2. The imaging device according to claim 1, wherein an area of the upper section is greater than an area of the logic chip.

3. The imaging device according to claim 1, wherein an area of the upper section is greater than an area of the memory chip.

4. The imaging device according to claim 1, wherein an area of the logic chip is greater than an area of the memory chip.

5. The imaging device according to claim 1, wherein a portion of the organic insulating layer is between the logic chip and the memory chip in a cross-sectional view.

6. The imaging device according to claim 1, wherein the organic insulating layer is formed by a coating method.

7. The imaging device according to claim 1, wherein the organic insulating layer includes a heat-resistant resin.

8. The imaging device according to claim 1, wherein
the lower section further includes a support substrate, the support substrate is adjacent to a side opposite to the upper section when viewed from the logic chip,
the organic insulating layer is provided to allow the organic insulating layer to cover a vicinity of the logic chip above the support substrate, and
a height position of an upper surface of the organic insulating layer is lower than a height position of an upper surface of the logic chip.

9. The imaging device according to claim 1, wherein the organic insulating layer has a thickness that is maximum at a position in contact with an edge surface of the logic chip and that is decreased with an increasing distance from the edge surface of the logic chip.

10. An electronic apparatus including an imaging device, wherein the imaging device comprises:
an upper section that includes a plurality of pixels; and
a lower section including a logic chip, a memory chip, and an organic insulating layer, wherein
the logic chip is bonded and electrically connected to the upper section,
the memory chip is bonded and electrically connected to the upper section, and
the logic chip and the memory chip are covered by the organic insulating layer.

* * * * *